United States Patent
Nardi et al.

(10) Patent No.: US 9,245,649 B2
(45) Date of Patent: Jan. 26, 2016

(54) RESISTIVE SWITCHING SAMPLE AND HOLD

(71) Applicant: Intermolecular Inc., San Jose, CA (US)

(72) Inventors: Federico Nardi, Palo Alto, CA (US); Ryan C. Clarke, San Jose, CA (US); Yun Wang, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 108 days.

(21) Appl. No.: 14/108,877

(22) Filed: Dec. 17, 2013

(65) Prior Publication Data

US 2015/0170760 A1    Jun. 18, 2015

(51) Int. Cl.
  *G11C 27/02*    (2006.01)
  *G11C 13/00*    (2006.01)

(52) U.S. Cl.
  CPC .......... *G11C 27/02* (2013.01); *G11C 13/0002* (2013.01); *G11C 13/0007* (2013.01)

(58) Field of Classification Search
  USPC ............ 327/94, 291, 299; 341/124, 125, 136
  See application file for complete search history.

(56) References Cited

U.S. PATENT DOCUMENTS

| 4,890,259 | A | | 12/1989 | Simko | |
| 5,450,023 | A | * | 9/1995 | Yang et al. | ............ 326/60 |
| 6,069,451 | A | * | 5/2000 | Hush et al. | ............ 315/169.1 |
| 6,434,049 | B1 | | 8/2002 | Trivedi | |
| 6,438,257 | B1 | * | 8/2002 | Morimura et al. | ............ 382/124 |

FOREIGN PATENT DOCUMENTS

EP    1804251 A2    7/2007

OTHER PUBLICATIONS

Wu, M., et al.; LowPower and Highly Reliable Multilevel Operation in ZrO2 1T1R RRAM; Aug. 1, 2011; IEEE; IEEE Electron Device Letters vol. 32 No. 8 pp. 10261028.
Elad Alon; MOS Sample and Hold; ; Department of EECS; Unknown.

* cited by examiner

*Primary Examiner* — An Luu

(57) ABSTRACT

A nonvolatile sample and hold circuit can include a resistive switching circuit, a sample circuit, a reset circuit, and a converter circuit. The resistive switching circuit can be operable to accept an input voltage Vg, and provide a resistance response Rrs that corresponds to the input signal Vg. The sampling circuit can be operable to sample an input signal such as an input voltage Vin, to provide a sampled voltage Vg. The reset circuit can be operable to reset the resistive switching circuit to a high resistance state. The converter circuit can be operable to convert the resistive switching circuit to an output voltage. The novel sample and hold circuit can have no issues related to charge injection, no settling time and instantaneous sampling time, together with potentially infinite hold time.

17 Claims, 13 Drawing Sheets

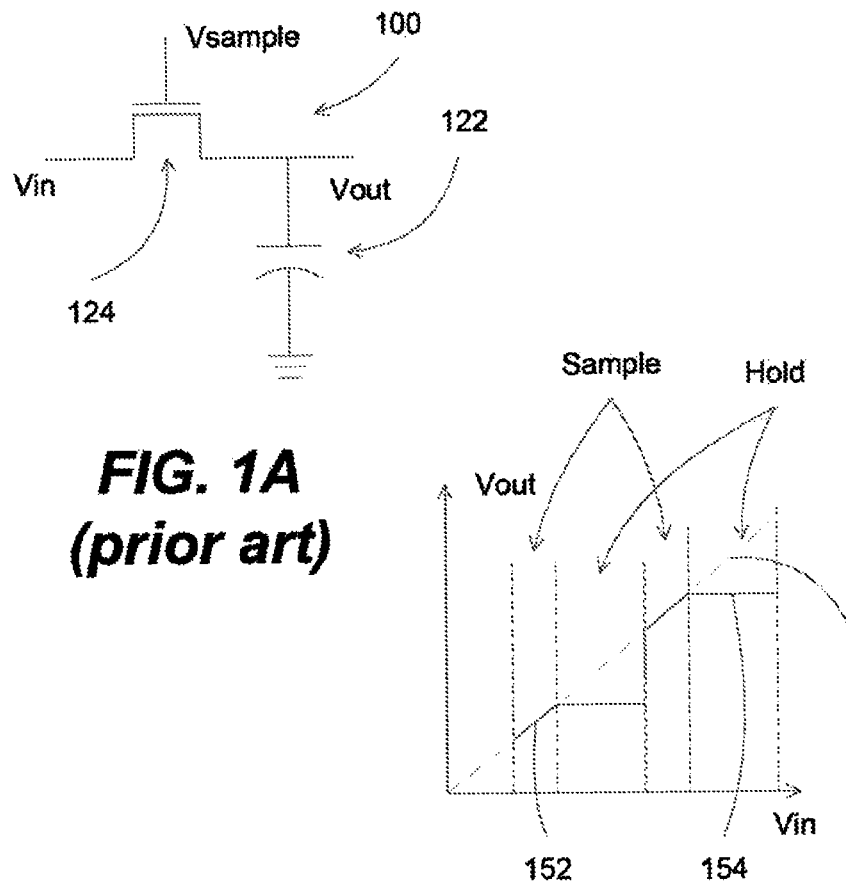
FIG. 1A
*(prior art)*
FIG. 1B
*(prior art)*
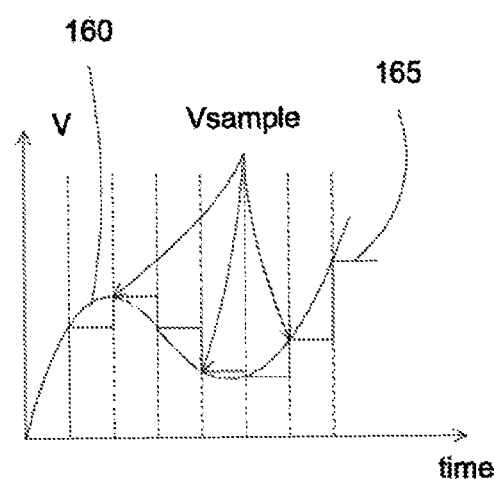
FIG. 1C
*(prior art)*

Incorporating a resistive switching device and a current control device to a nonvolatile sample and hold circuit, wherein the current control device is configured to accept an input voltage, wherein the current control device is configured to control a current through the resistive switching device as a function of the input voltage
700

FIG. 7A

Providing a circuit having a resistive switching device and a current controlling device
730

Applying an input voltage to the circuit to achieve a sample and hold function, wherein the circuit comprises a transfer function of a resistance – voltage curve
740

FIG. 7B

Incorporating a resistive switching circuit, a sampling circuit, and a reset circuit to form a nonvolatile sample and hold circuit, wherein the nonvolatile sample and hold circuit is operable to sample an input voltage and generate a hold resistance value corresponded to the sampled input voltage
1000

FIG. 10A

Providing a circuit having a resistive switching circuit, a sampling circuit, and a reset circuit
1030

Resetting the resistive switching circuit
1040

Sampling the input voltage
1050

Applying the sampled input voltage to the resistive switching circuit to achieve a sample and hold function
1060

FIG. 10B

Incorporating a resistive switching circuit, a sampling circuit, a reset circuit, and a converter circuit to form a nonvolatile sample and hold circuit, wherein the nonvolatile sample and hold circuit is operable to sample an input voltage and generate a hold output voltage corresponded to the sampled input voltage
1300

*FIG. 13A*

Providing a circuit having a resistive switching circuit, a sampling circuit, and a reset circuit
1330

↓

Resetting the resistive switching circuit
1340

↓

Sampling the input voltage
1350

↓

Applying the sampled input voltage to the resistive switching circuit to set a resistance value for the resistive switching circuit
1360

↓

Converting the resistance value to an output voltage
1370

*FIG. 13B*

RESISTIVE SWITCHING SAMPLE AND HOLD

FIELD OF THE INVENTION

This invention relates generally to resistive switching elements, and more particularly, to methods, and circuits resulted from the methods, for forming sample and hold circuits having resistive switching elements.

BACKGROUND

A sample and hold (S/H) circuit is an analog device that samples, e.g., captures, the voltage of an input analog signal and holds its value, e.g., keeping it at a constant level for a period of time regardless of the changes of the input signal. Sample and hold circuits can be considered as the elementary analog memory devices. Sample and hold circuits can be used in analog-to-digital converters to eliminate variations in input signal that can corrupt the conversion process.

A typical sample and hold circuit can use a capacitor to maintain the constant output level when the input signal changes. To sample the input voltage, a switch, such as a field effect transistor (FET) switch, can connect the input voltage to the capacitor so that the voltage across the capacitor is practically equal, or proportional to, the input voltage. An operation amplifier can be used to improve the input impedance and the charge or discharge rate of the capacitor. In hold mode, the switch disconnects the capacitor from the input voltage. The capacitor provides a constant output voltage that is equal or proportional to the sampled input voltage. The capacitor will eventually discharge, for example, by its leakage current and the load currents, so the hold time of the sample and hold circuit is determined by the voltage drop within an acceptable error margin.

FIGS. 1A-1C illustrate a schematic behavior of a prior art sample and hold circuit. FIG. 1A shows a simple sample and hold circuit 100, including a capacitor 122 for holding the voltage and a FET switch 124 for sampling the input voltage. During the sample time, the FET switch is on so that the input Vin is connected to the capacitor 122, charging or discharging the capacitor 122 so that the voltage Vout across the capacitor 122 is equal to the input voltage Vin. During the hold time, the FET switch is off, and the input voltage Vin is disconnected from the capacitor 122 and the output voltage Vout. The output voltage Vout remains the same, e.g., held by the charges in the capacitor 122. Other components can be added to the sample and hold circuit 100, such as an operation amplifier before the FET switch 124 and another operation amplifier after the capacitor 122.

FIG. 1B shows a response function of the sample and hold circuit 100, which includes the values of the output voltages given the input voltages. During the sample times 152, the output voltages follow the variation of the input voltages. During the hold times 154, the output voltages remain constant, regardless of the changes in input voltages.

FIG. 1C shows the time evolutions of the input voltage 160 and output voltage 165. The input voltage 160 can vary with respect to time. At sampling times, the output voltage 165 captures the input voltage 160, and holds its value until the next sampling time. As shown, the output voltages at the sampling time are equal to the input voltages. There can be other responses, for example, the output voltage can be a function of the input voltage.

The sample and hold circuits discussed can have issues that need to be improved, such as capacitance charge injection during the switch transistor operation, the necessity of a settling time before the sampling time (e.g., for charging of the capacitance), and short holding time (due to capacitance discharge). Longer hold time can be obtained by using larger capacitance, but at the expense of longer settling time.

Therefore, there is a need for a sample and hold circuit that can meet the design criteria for advanced devices.

SUMMARY

In some embodiments, methods and circuits for forming sample and hold circuits are provided. The sample and hold circuits can include a resistive switching element, which can act as a nonvolatile holding component for holding the input signal. For example, the resistance of the resistive switching element can be set as a function of the input voltage during a sample time. The resistive switching element is a nonvolatile element, thus the resistance value of the resistive switching element is constant for a long hold time.

In some embodiments, circuits having a transfer function of nonvolatile resistance vs input voltage are provided. The circuits can include a nonvolatile resistive switching element, which is coupled to the input voltage. The input voltage can be configured to set the resistance of the resistive switching element to be a function of the input voltage, for example, through a current controlling device. Thus a sample and hold circuit can be formed, including a resistive switching element holding a resistance value, which is a function of the input voltage.

In some embodiments, a reset component can be added to the sample and hold circuit. The reset component can be operable to reset the value of the resistive switching element, such as applying a reset voltage across the resistive switching element to bring the resistive switching element to a high resistance state. The reset operation can be performed before the sampling operation, resetting the resistance of the resistive switching element, so that the resistive switching element is ready to accept the sampling input voltage.

In some embodiments, circuits having a transfer function of nonvolatile output voltage vs input voltage are provided. The circuits can include a converter component, in addition to the resistive switching sample and hold circuits. The converter component can convert the resistance of the resistive switching element to a desired output, such as an output voltage. For example, the converted component can include a current source, which can pass through the resistive switching element to generate an output voltage proportional to the resistance of the resistive switching element.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIGS. 1A-1C illustrate a schematic behavior of a prior art sample and hold circuit.

FIGS. 7A-7B illustrate flowcharts for forming and operating a nonvolatile sample and hold circuit having a resistive switching element according to some embodiments.

FIGS. 10A-10B illustrate other flowcharts for forming and operating a nonvolatile sample and hold circuit having a resistive switching element according to some embodiments.

FIGS. 13A-13B illustrate other flowcharts for forming and operating a nonvolatile sample and hold circuit having a resistive switching element according to some embodiments.

DETAILED DESCRIPTION

Figure 2A:
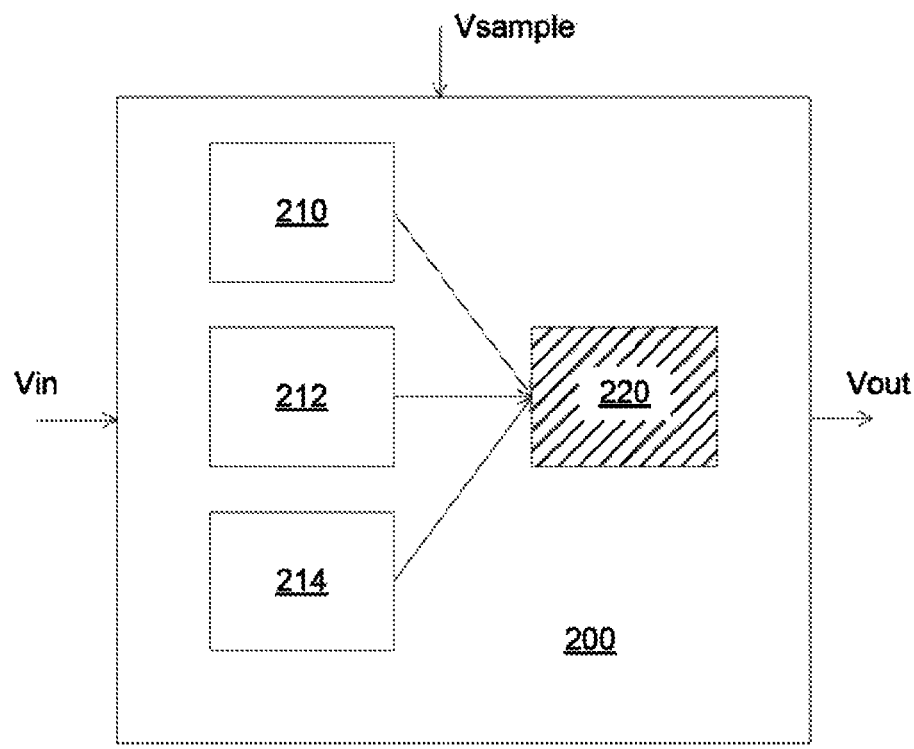
FIGS. 2A-2C illustrate a schematic behavior of a resistive switching sample and hold circuit according to some embodiments.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

In some embodiments, methods and sample and hold (S/H) circuits are provided in which a resistive switching element can be operable as a holding component for the signal. For example, the S/H circuit can sample an input signal, and then use the sampled signal to set the resistance of the resistive switching element. Since the resistive switching element is a nonvolatile memory element, the resistance value can have a long hold time.

In some embodiments, the S/H circuit can further include a sampling circuit, which can be operable to sample an input signal, such as an input voltage. The output of the sampling circuit can be coupled to the resistive switching element to set the resistance of the resistive switching element. For example, the output of the sampling circuit can be used to control a current through the resistive switching element, putting the resistive switching element in a resistance state that is inversely proportional to the controlling current.

In some embodiments, the S/H circuit can further include a reset circuit, which can be operable to reset the resistance state of the resistive switching element. For example, the resistance setting of the resistive switching element can have a hysteresis behavior, e.g., different resistance values can be obtained for a same applied voltage or current, depending on the past history of the resistive switching element. Thus a reset circuit can be included to reset the resistive switching element, e.g., putting the resistive switching element in a high resistance state (low conductivity state) before applying the sampled voltage for setting the resistance of the resistive switching element.

In some embodiments, the S/H circuit can further include a converter circuit, which can be operable to convert the non-volatile resistance value to any desired output. For example, a converter circuit having a current source can be coupled to the resistive switching element to generate an output voltage, e.g., converting the output resistance to an output voltage. The converter circuit can be linear or non-linear, which can change the transfer function of the S/H circuit.

In some embodiments, the present disclosure extends the use of resistive switching materials beyond the application in non-volatile memory devices, and to apply resistive switching materials to the implementation of hybrid transistor-resistive switching logic circuits. Methods to form resistive switching sample and hold circuits are provided, which can represent a fundamental building block toward the implementation of a real hybrid transistor-resistive switching electronics.

In some embodiments, the architecture for the resistive switching sample and hold circuit can be obtained by replacing the capacitor used for the dynamic storage of information with a non-volatile resistive switching element. The resistive switching sample and hold circuits can provide significant advantages over capacitance-based sample and hold circuits, including no charge injection (since the resistive switching element is not a capacitance), no settling time and fast sampling time (since the resistive switching transition is in the pico second range), and long hold time (since the resistive switching element is non-volatile).

The resistive switching sample and hold circuits can have a non-linear relationship between the input and the output, due to the non-linear behavior of the resistive switching element. In some cases, this can be an advantage due to a quadratic amplification of the signal. In some cases, a converter circuit can be provided to generate a linear relationship.

Figure 2B:
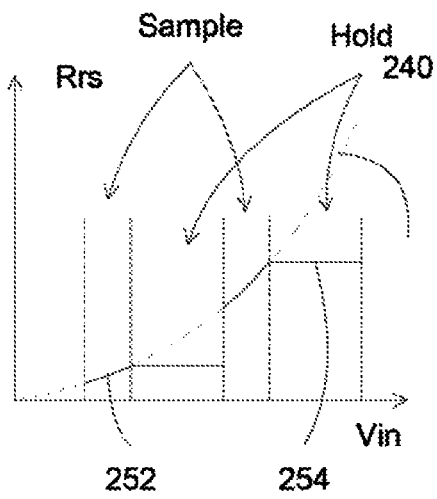
Figure 2C:
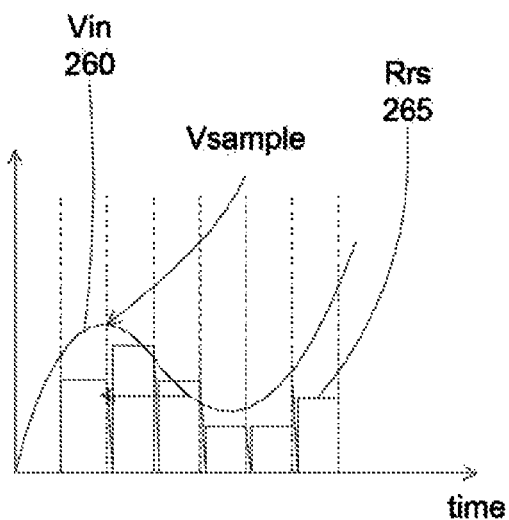

FIGS. 2A-2C illustrate a schematic behavior of a resistive switching sample and hold circuit according to some embodiments. FIG. 2A shows a schematic block diagram of a resistive switching sample and hold circuit 200. The circuit 200 can accept an input voltage Vin and a sampling signal Vsample. The circuit 200 can output an output voltage Vout. The circuit 200 can include a resistive switching element 220, which can be operable to hold its resistance during the hold time of the sample and hold circuit 200. The circuit 200 can include a sampling circuit 210, which can be operable to sample the input voltage Vin. The circuit 200 can include a current controlling circuit 212, which can be operable to set the resistive switching element 220 based on the sampled signal. The circuit 200 can include a converter circuit 214, which can be operable to convert the resistance value of the resistive switching element 220 to any type of desired output signal, such as non-linear output voltage, or linear output voltage.

As shown, the circuit 200 provides a voltage-voltage transfer function, e.g., generating an output voltage from an input voltage. Other circuit configurations can be used, such as different types of input or output signals, including input current, output current, or output resistance.

FIG. 2B shows a partial response function of the sample and hold circuit 200, which includes the values of the resistance of the resistive switching element given the input voltages. During the sample times 252, the resistance follow the variation of the input voltages. During the hold times 254, the resistance remain constant, regardless of the changes in input voltages. As shown, the relationship between the input voltage Vin and the resistance Rrs of the resistive switching element is non-linear, representing the behavior of a metal oxide resistive switching element. Different resistive switching elements can exhibit different relationships.

FIG. 2C shows the time evolutions of the input voltage Vin 260 and resistance Rrs 265. The input voltage 260 can vary with respect to time. At sampling times, the resistance Rrs 265 captures the input voltage 260, and holds its value until the next sampling time. As shown, the relationship between the resistance Rrs and the input voltage is not linear, resulting in non-linear transfer function for the sample and hold circuit.

The nonvolatile behavior of a resistive switching element can allow the implementation of non volatile sample and hold circuits, e.g., sample and hold circuits using resistive switching elements as the components for holding the signal. A description of the resistive switching element is provided below, in the context of a resistive memory device, to elucidate the behavior of the resistive switching element, and to allow an understanding of the incorporation of the resistive switching element in a sample and hold circuit.

A resistive switching random access memory (ReRAM) cell exhibiting resistive switching characteristics generally includes multiple layers formed into a stack. The structure of this stack is sometimes described as a Metal-Insulator-Metal (MIM) structure. Specifically, the stack includes two conductive layers operating as electrodes. These layers may include metals and/or other conductive materials. The stack also includes an insulator layer disposed in between the electrodes. The insulator layer exhibits resistive switching properties characterized by different resistive states of the material forming this layer. As such, this insulator layer is often referred to as a resistive switching layer. These resistive states may be used to represent one or more bits of information. The resistance switching properties of the insulator layer are believed to depend on various defects' presence and distribution inside this layer. For example, different distribution of oxygen vacancies in the layer may reflect different resistance states of the layer, and these states may be sufficiently stable for memory application.

To achieve a certain concentration of defects in the resistance switching layer, the layer has been conventionally deposited with defects already present in the layer, i.e., with preformed defects. In other words, defects are introduced into the layer during its formation. For example, tightly controlled Atomic Layer Deposition (ALD), Physical Vapor Deposition (PVD), or some other low-temperature process to remain within a Back End of Line (BEOL) thermal budget may be used to deposit the insulator layer of the stack. It may be difficult to precisely and repeatedly control formation of these defects particularly in very thin resistance switching layers (e.g., less than 100 Angstroms). For example, when ALD is used to form resistance switching layers, some unreacted precursors may leave carbon-containing residues that impact resistance characteristics of the deposition layers and ReRAM cells including these layers. Furthermore, achieving precise partial saturation repeatedly may be very difficult if possible at all. In the case of PVD, sputtering targets tend to wear out influencing the deposition rates and creating variation in resulting resistance switching layers.

Methods of forming nonvolatile memory elements can involve transferring oxygen from precursor layers (used to form or, more specifically, converted into resistance switching layers) to electrodes during annealing of the stacks. The annealing environment may include some hydrogen to control distribution of oxygen within the annealed structure.

As stated above, oxygen diffusion from the precursor layer into the electrode converts the precursor layer into a resistance switching layer. The precursor layer may include a stoichiometric oxide or near-stoichiometric oxide that cannot function as a resistance switching layer until oxygen vacancies or some other defects are formed within that layer. The metal of this oxide may be more electronegative than the metal of the electrode used to trap the oxygen diffused out of the precursor level. The electrode may have substantially no oxygen at least prior to the oxygen transfer but may form an oxide during annealing.

The stack may have a reactive electrode that receives some oxygen during annealing and an inert electrode that generally does not participate in oxygen transfer. The inert electrode may be referred to as an oxygen-resistant electrode and may be made from titanium nitride, tantalum nitride, platinum, gold, and the like. Other suitable materials for inert electrodes include various conductive oxide, such as iridium oxide and ruthenium oxide. In some embodiments, the inert electrode includes an oxide sub-layer facing the resistance switching layer. The rest of the electrode may be formed by the metal of this oxide and may be generally free of oxygen. For example, an initial structure may be fabricated from a metal and then pretreated to form an oxide layer resulting in an inert electrode. This electrode then receives a precursor layer and another reactive electrode formed over the precursor layer. During subsequent annealing, the inert electrode does not experience any significant oxygen transfer, while the reactive electrode receives oxygen from the precursor layer that is converted into the resistive switching oxide layer as it loses oxygen.

If an inert electrode with a protective oxide layer is a first formed electrode in the stack (i.e., the bottom electrode), then it can be first deposited as a metal layer followed by a short low-temperature anneal in oxygen. On the other hand, if an inert electrode is the last electrode formed in the stack (i.e., the top electrode), then its deposition can be initiated in the oxygen environment (e.g., sputtering in an oxygen-containing plasma) to form an initial oxide sub-layer followed by deposition in an inert environment to form the remaining metal (and oxygen free) portion of the electrode.

A reactive electrode can made from a material that reacts with oxygen to form a non-conductive oxide. Some examples of suitable materials include aluminum, titanium, tantalum, chromium, praseodymium, molybdenum, tungsten, and niobium.

A precursor layer may be made from materials, such as tantalum oxide ($Ta_2O_5$), niobium oxide ($Nb_2O_5$), titanium oxide ($TiO_2$), hafnium oxide ($HfO_2$), strontium titanate ($SrTiO_3$), or other suitable transition metal oxides, perovskite manganites, or rare earth oxides. The precursor layer may include a stoichiometric oxide or near-stoichiometric oxide. For example, oxygen vacancies in the precursor layer may have a concentration of less than 0.1 atomic percent prior to its annealing.

Annealing may be performed on a fully formed stack including two electrodes and precursor layer or a partially formed stack that includes only one electrode (the second electrode is formed after the annealing). Other types of layers may also be present in these stacks. As stated above, annealing performed at relatively mild conditions to achieve better control over oxygen diffusion between one or more reactive layers and precursor layer. Annealing may form a graded composition of oxygen vacancies in the precursor layer.

The resistive switching layer changes its resistive state when a certain switching voltage (e.g., a set voltage or a reset voltage) is applied to this layer as further explained below. The applied voltage causes localized heating within the layer and/or at one of both of its interfaces with other components. Without being restricted to any particular theory, it is believed that a combination of the electrical field and localized heating (both created by the applied voltage) causes formation and breakage of various conductive paths within the resistive switching layer and/or at its interfaces. These conductive paths may be established and broken by moving defects (e.g., oxygen vacancies) within the resistive switching layer and through one or more interfaces that resistive switching layer forms with adjacent layers.

The interfaces can be inert interfaces or reactive interfaces. The inert interface generally does not have any substantial defect transfer through this interface. While the defects may be present within one or both layers forming this interface, these defects are not exchanged through the inert interface when switching, reading, or other types of voltages are applied to the ReRAM cell. The reactive interface generally experiences a transfer of defects through this interface. When a resistive switching layer includes an oxygen containing material, such as metal oxides, the reactive interface is formed by an oxygen reactive material, such as titanium. The inert interface may be formed by a material that is not oxygen reactive, which may be a part of an electrode or a diffusion barrier layer. In some embodiments, the flux of defects through the reactive interface is at two or more orders of magnitude greater than the flux of defects through the inert interface. As such, the "inert" and "reactive" naming convention is relative.

The inert interface provides a control for the resistive switching layer while defects are moved in and out of the resistive switching layer through the reactive interface. For example, when a switching voltage is applied to the resistive switching layer in order to reduce its resistance, the reactive interface allows defects to flow into the layer. The defects are typically driven by the electrical potential applied to the layer and form conductive paths through the layer. The direction of this flow may be determined by the polarity of the switching voltage and/or by the electrical charge of the defects (e.g., positive charged oxygen vacancies). At the same time, the second inert interface prevents defects from escaping the layer despite the driving potential. If both interfaces are reactive and allow defects to pass through, then the resistive switching layer may gain defects at one interface and loose at another. In this situation, the layer may never be able to gain enough defects to form conductive paths.

The above scenario is applicable in a very similar manner to a resetting operation during which the resistive switching layer is brought to its high resistance state. When a switching voltage is applied to the layer in order to increase its resistance of the layer, the reactive interface allows defects to flow out of the layer. The defects may also be driven by the electrical potential applied to the layer as described above. The loss of defects may eventually break conductive paths in the layer. At the same time, the second inert interface prevents defects from entering the layer despite the driving potential. If both interfaces are reactive and allow defects to pass through during the resetting operation, then the resistive switching layer may gain defects at one interface and loose at another. In this situation, the layer may never be able to lose enough defects in order to break it conductive paths.

The ability of an interface to block defects (as in the inert interface) or to allow defects to diffuse through the interface (as in the reactive interface) depends on properties of a layer forming this interface together with the resistive switching layer. Often conductive electrodes are used to form both reactive and inert interfaces. These electrodes may be referred to as reactive and inert electrodes and materials used to form these electrodes may be referred to as reactive and inert materials. It should be noted that this terminology (i.e., reactive and inert) refers primarily to defect mobility properties of the interfaces. Some examples of inert electrode materials include doped polysilicon, platinum, ruthenium, ruthenium oxide, gold, iridium, coppers, silver, and tungsten. Examples of reactive electrode materials include titanium. Furthermore, some materials may be defined as semi-inert including tantalum nitride, tantalum silicon nitride, and tungsten silicon nitride. In the context of oxygen containing resistive switching materials, such as metal oxides, reactive materials may be also referred to as oxygen reaction materials since oxygen or oxygen vacancies are exchanged through the reactive interface. Titanium is one example of oxygen reactive materials, however other examples may be used as well.

A brief description of ReRAM cells and their switching mechanisms are provided for better understanding of various features and structures associated with methods of forming nonvolatile memory elements further described below. ReRAM is a non-volatile memory type that includes dielectric material exhibiting resistive switching characteristics. A dielectric, which is normally insulator, can be made to conduct through one or more filaments or conduction paths formed after application of a sufficiently high voltage. The conduction path formation can arise from different mechanisms, including defects, metal migration, and other mechanisms further described below. Once the one or more filaments or conduction paths are formed in the dielectric component of a memory device, these filaments or conduction paths may be reset (or broken resulting in a high resistance) or set (or re-formed resulting in a lower resistance) by applying certain voltages. Without being restricted to any particular theory, it is believed that resistive switching corresponds to migration of defects within the resistive switching layer and, in some embodiments, across one interface formed by the resistive switching voltage, when a switching voltage is applied to the layer.

Figure 3A:
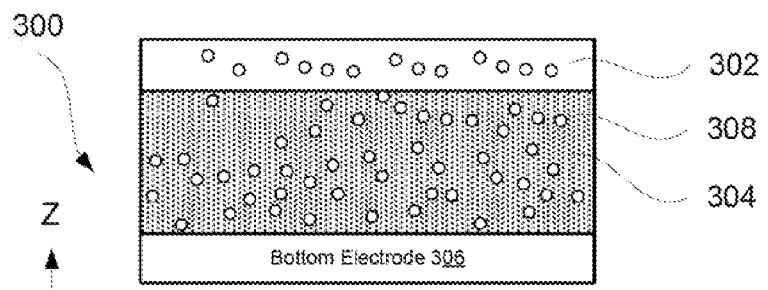
FIGS. 3A-3C illustrate a schematic representation of a ReRAM operation according to some embodiments.
Figure 3B:
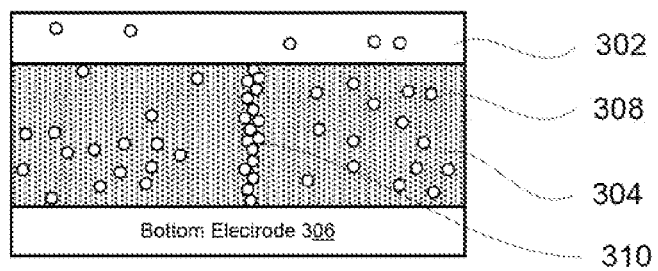
Figure 3C:
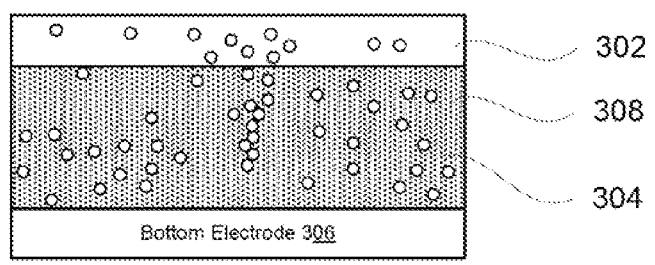

FIGS. 3A-3C illustrate a schematic representation of a ReRAM operation according to some embodiments. A basic building unit of a memory device is a stack having a capacitor like structure. A ReRAM cell includes two electrodes and a dielectric, which acts as a resistive switching layer, positioned in between these two electrodes. FIG. 3A illustrates a schematic representation of ReRAM cell 300 including top electrode 302, bottom electrode 306, and resistance switching layer 304 provided in between top electrode 302 and bottom electrode 306. It should be noted that the "top" and "bottom" references for electrodes 302 and 306 are used solely for differentiation and not to imply any particular spatial orientation of these electrodes. Often other references, such as "first formed" and "second formed" electrodes or simply "first" and "second", are used identify the two electrodes. ReRAM cell 300 may also include other components, such as an embedded resistor, diode, and other components. ReRAM cell 300 is sometimes referred to as a memory element or a memory unit.

Top electrode 302 and bottom electrode 306 may be used as conductive lines within a memory array or other types of devices incorporating a ReRAM cell. As such, electrode 302 and 306 are generally formed from conductive materials. As stated above, one of the electrodes may be a reactive electrode and act as a source and as a reservoir of defects for the resistive switching layer. That is, defects may travel through an interface formed by this electrode with the resistive switching layer (i.e., the reactive interface). The other interface of the resistive switching layer may be inert and may be formed with an inert electrode or a diffusion barrier layer.

Resistance switching layer 304 which may be initially formed from a dielectric material and later can be made to conduct through one or more conductive paths formed within the layer by applying first a forming voltage and then a switching voltage. To provide this resistive switching functionality, resistance switching layer 304 includes a concentration of electrically active defects 308, which may be at least partially provided into the layer during its fabrication. For example, some atoms may be absent from their native structures (i.e., creating vacancies) and/or additional atoms may be inserted into the native structures (i.e., creating interstitial defects). Charge carriers may be also introduced as dopants, stressing lattices, and other techniques. Regardless of the types, all charge carriers are referred to as defects 308.

In some embodiments, these defects may be utilized for ReRAM cells operating according to a valence change mechanism, which may occur in specific transition metal oxides, nitrides, and oxy-nitrides. For example, defects may be oxygen vacancies triggered by migration of oxygen anions. Migrations of oxygen anions correspond to the motion of corresponding oxygen vacancies that are used to create and break conductive paths. A subsequent change of the stoichiometry in the transition metal oxides leads to a redox reaction expressed by a valence change of the cation sublattice and a change in the electrical conductivity. In this example, the polarity of the pulse used to perform this change determines the direction of the change, i.e., reduction or oxidation. Other resistive switching mechanisms include bipolar electrochemical metallization mechanisms and thermochemical mechanisms, which leads to a change of the stoichiometry due to a current-induced increase of the temperature. Some of these mechanisms will be further described below with reference to FIGS. 3A-3C. In the described examples, top electrode 302 is reactive, while bottom electrode 306 is inert or is separated from resistive switching layer 304 by a diffusion barrier layer (not shown). One having ordinary skills in the art would understand that other arrangements are possible as well and within the scope of this disclosure.

Specifically, FIG. 3A is a schematic representation of ReRAM cell 300 prior to initial formation of conductive paths, in accordance with some embodiments. Resistive switching layer 304 may include some defects 308. Additional defects 308 may be provided within top electrode 302 and may be later transferred to resistive switching layer 304 during the formation operation. In some embodiments, the resistive switching layer 304 has substantially no defects prior to the forming operation and all defects are provided from top electrode 302 during forming. Bottom electrode 306 may or may not have any defects. It should be noted that regardless of the presence or absence of defects in bottom electrode 306, substantially no defects are exchanged between bottom electrode 306 and resistive switching layer 304 during forming and/or switching operations.

During the forming operation, ReRAM cell 300 changes its structure from the one shown in FIG. 3A to the one shown in FIG. 3B. This change corresponds to defects 308 being arranged into one or more continuous paths within resistive switching layer 304 as, for example, schematically illustrated in FIG. 3B. Without being restricted to any particular theory, it is believed that defects 308 can be reoriented within resistance switching layer 304 to form these conductive paths 310 as, for example, schematically shown in FIG. 3B. Furthermore, some or all defects 308 forming the conductive paths may enter resistive switching layer 304 from top electrode 302. For simplicity, all these phenomena are collectively referred to as reorientation of defects within ReRAM cell 300. This reorientation of defects 308 occurs when a certain forming voltage 304 is applied to electrodes 302 and 306. In some embodiments, the forming operation also conducted at elevated temperatures to enhanced mobility of the defects within ReRAM cell 300. In general, the forming operation is considered to be a part of the fabrication of ReRAM cell 300, while subsequent resistive switching is considered to be a part of operation of ReRAM cell.

Resistive switching involves breaking and reforming conductive paths through resistive switching layer 304, i.e., switching between the state schematically illustrated in FIG. 3B and the state schematically illustrated in FIG. 3C. The resistive switching is performed by applying switching voltages to electrodes 302 and 306. Depending on magnitude and polarity of these voltages, conductive path 310 may be broken or re-formed. These voltages may be substantially lower than forming voltages (i.e., voltages used in the forming operation) since much less mobility of defects is needed during switching operations. For example, hafnium oxide based resistive layers may need about 7 Volts during their forming but can be switched using voltages less than 4 Volts.

The state of resistive switching layer 304 illustrated in FIG. 3B is referred to as a low resistance state (LRS), while the state illustrated in FIG. 3C is referred to as a high resistance state (HRS). The resistance difference between the LRS and HRS is due to different number and/or conductivity of conductive paths that exists in these states, i.e., resistive switching layer 304 has more conductive paths and/or less resistive conductive paths when it is in the LRS than when it is in the HRS. It should be noted that resistive switching layer 304 may still have some conductive paths while it is in the HRS, but these conductive paths are fewer and/or more resistive than the ones corresponding to the LRS.

When switching from its LRS to HRS, which is often referred to as a reset operation, resistive switching layer 304 may release some defects into top electrode 302. Furthermore, there may be some mobility of defects within resistive switching layer 304. This may lead to thinning and, in some embodiments, breakages of conductive paths as shown in FIG. 3C. Depending on mobility within resistive switching layer 304 and diffusion through the interface formed by resistive switching layer 304 and top electrode 302, the conductive paths may break closer to the interface with bottom electrode 306, somewhere within resistive switching layer 304, or at the interface with top electrode 302. This breakage generally does not correspond to complete dispersion of defects forming these conductive paths and may be a self limiting process, i.e., the process may stop after some initial breakage occurs.

When switching from its HRS to LRS, which is often referred to as a set operation, resistive switching layer 304 may receive some defects from top electrode 302. Similar to the reset operation described above, there may be some mobility of defects within resistive switching layer 304. This may lead to thickening and, in some embodiments, reforming of conductive paths as shown in FIG. 3B. In some embodiments, a voltage applied to electrodes 302 and 304 during the set operation has the same polarity as a voltage applied during the reset operation. This type of switching is referred to as unipolar switching. Some examples of cells that exhibit unipolar switching behavior include resistive switching layers formed from most metal oxide and having inert electrodes at both sides, e.g., Pt/MeO$_x$/Pt. Alternatively, a voltage applied to electrodes 302 and 304 during the set operation may have different polarity as a voltage applied during the reset operation. This type of switching is referred to as bipolar switching. Some examples of cells that exhibit bipolar switching behavior include resistive switching layers formed from MeOx having one inert electrode and one reactive electrode, e.g., TiN/MeOx/Pt and TiN/MeOx/poly-Si. Setting and resetting operations may be repeated multiple times as will now be described with reference to FIG. 4.

Figure 4:
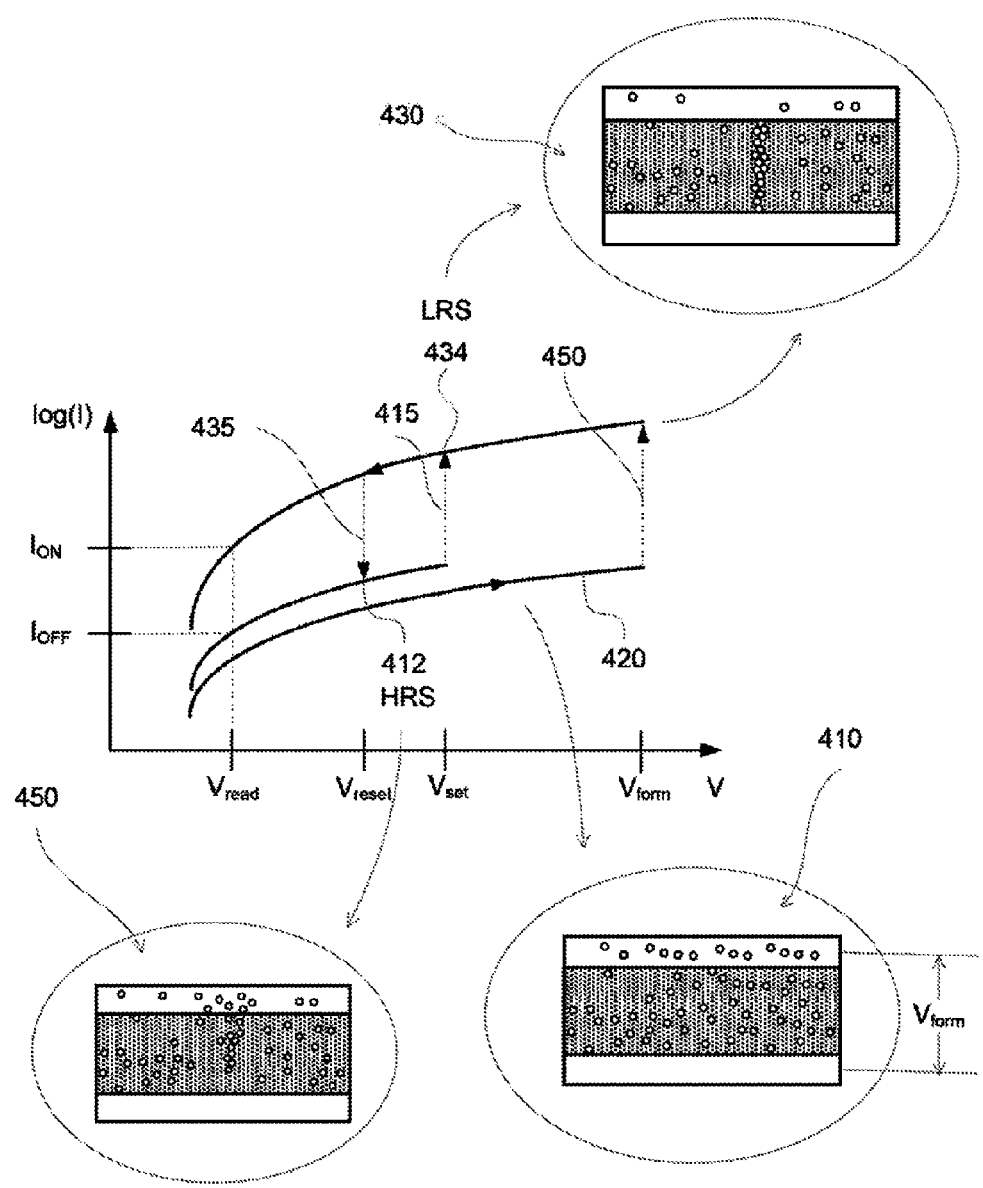
FIG. 4 illustrates a plot of a current passing through a unipolar ReRAM cell as a function of a voltage applied to the ReRAM cell according to some embodiments.

FIG. 4 illustrates a plot of a current passing through a unipolar ReRAM cell as a function of a voltage applied to the ReRAM cell according to some embodiments. A metal-insulator-metal (MIM) structure 410 can be first fabricated with an amount of defects embedded in the insulator layer. A voltage 420 can be applied to the MIM structure to form a resistive memory device from the MIM structure, for example, by making the insulator layer becoming a switching layer. By applying a forming voltage $V_{form}$, the randomly distributed defects can be transitioned 450 to lower resistance configurations, for example, in the form of filaments 430.

The lower resistance configurations can be characterized as a low resistance state (LRS) 434 for the resistive memory device, which persists even when the voltage is reduced. The LRS can represent a logic state of the memory device, such as a logic zero ("0").

At LRS, when another voltage, e.g., $V_{reset}$ is applied, the resistance can be transitioned 435 to a high resistance state (HRS), which persists even when the voltage is reduced. The HRS can represent another logic state of the memory device, such as a logic one ("1"). The reset voltage $V_{reset}$ is smaller than the forming voltage $V_{form}$.

At HRS, when another voltage, e.g., $V_{set}$ is applied, the resistance can be transitioned 415 back to the low resistance state (LRS), which persists even when the voltage is reduced. The set voltage $V_{set}$ is also smaller then the forming voltage $V_{form}$.

Overall, the ReRAM cell may be switched back and forth between its LRS and HRS many times. For example, when it is desired to turn "ON" the cell, e.g., to have a LRS, a set operation can be performed through the application of a set voltage $V_{set}$ to the electrodes. Applying the set voltage forms one or more conductive paths in the resistance switching layer as described above with reference to FIG. 3B. If it is desired to turn "OFF" the ReRAM cell, e.g., to change to HRS, a reset operation can be preformed through the application of a reset voltage $V_{reset}$ to the electrodes. Applying the reset voltage can destroy the conductive paths in the resistance switching layer as described above with reference to FIG. 3C.

The polarity of the reset voltage and the set voltage may be the same in unipolar memory devices, or may be different in bipolar devices (not shown). Without being restricted to any particular theory, it is believed that the resistive switching occurs due to filament formation and destruction caused by the application of electrical field.

Read operations may be performed in each of these states (between the switching operations) one or more times or not performed at all. During the read operation, the state of the ReRAM cell or, more specifically, the resistive state of its resistance of resistance switching layer can be sensed by applying a sensing voltage to its electrodes. The sensing voltage is sometimes referred to as a read voltage $V_{read}$.

In some embodiments, the set voltage $V_{set}$ is between about 100 mV and 10V or, more specifically, between about 500 mV and 5V. The length of set voltage pulses may be less than about 100 milliseconds or, more specifically, less than about 5 milliseconds and even less than about 100 nanoseconds. The read voltage $V_{read}$ may be between about 0.1 and 0.5 of the set voltage $V_{set}$. In some embodiments, the read currents ($I_{ON}$ and $I_{OFF}$) are greater than about 1 mA or, more specifically, is greater than about 5 mA to allow for a fast detection of the state by reasonably small sense amplifiers. The length of read voltage pulse may be comparable to the length of the corresponding set voltage pulse or may be shorter than the write voltage pulse. ReRAM cells should be able to cycle between LRS and HRS between at least about $10^3$ times or, more specifically, at least about $10^7$ times without failure. A data retention time should be at least about 5 years or, more specifically, at least about 10 years at a thermal stress up to 85° C. and small electrical stress, such as a constant application of the read voltage. Other considerations may include low current leakage, such as less than about 40 A/cm² measured at 0.5 V per 20 Å of oxide thickness in HRS.

In some embodiments, the resistive switching element, e.g., including the resistive memory device which has a resistive switching element dispose between two electrodes, can be used in a sample and hold circuit. The nonvolatile characteristic of the resistive switching element (or the resistive memory device) can be used to hold the value of a sampled input signal. For example, a sampling circuit can be used to sample an input voltage, which can be used to set the resistance of the resistive switching element. When the input voltage is disconnected, the resistive switching element still maintains the same resistance, which acts as a hold function for the sampled signal.

In some embodiments, a converter circuit can be added to convert the resistance of the resistive switching element to a desired signal. For example, a voltage can be applied to the resistive switching element to provide an output current, which is proportional to the resistance of the resistive switching element. Alternatively, a current can be applied to generate an output voltage.

Figure 5A:
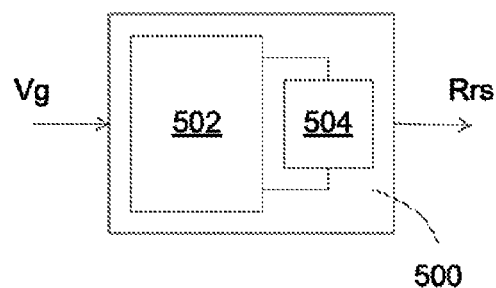
FIGS. 5A-5C illustrate a schematic behavior of a sample and hold circuit having a resistive switching element according to some embodiments.
Figure 5B:
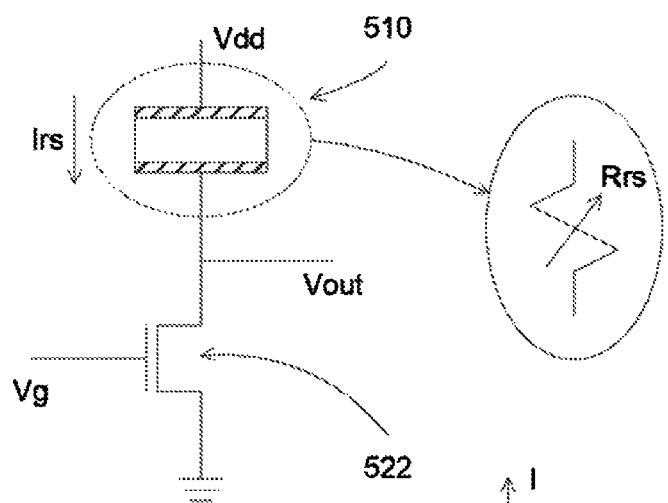
Figure 5C:
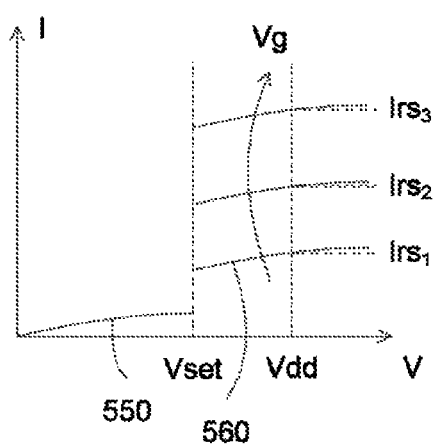

FIGS. 5A-5C illustrate a schematic behavior of a sample and hold circuit having a resistive switching element according to some embodiments. FIG. 5A shows a schematic block of the sample and hold (S/H) circuit 500, which includes a resistive switching element 504 and a driving circuit 502. As shown, the S/H circuit 500 has a resistance-voltage transfer characteristic, e.g., having an input voltage Vin and an output resistance Rrs.

FIG. 5B shows an example of a S/H circuit 500, including a resistive switching element 510 (which is disposed between two electrodes) coupled to a control transistor 522. The resistive switching element 510 can have a variable resistance Rrs, which can be set by a current through the resistive switching element. The circuit can be connected to a power supply Vdd and a gate voltage Vg for the transistor 522. The current through the resistive switching element 510 can be controlled by the gate voltage Vg of the control transistor 522. The transistor 522 can be operable in a saturation mode, e.g., the transistor is biased so that the current through the transistor is essentially constant (or not changing significantly) with changes in the voltage between the source and drain.

FIG. 5C shows I-V characteristics of the current Irs through the resistive switching element as a function of the applied voltage V to the resistive switching element. The current Irs slowly increases when the voltage V increases. When the voltage V reaches the set voltage Vset for the resistive switching element, the resistive switching element undergoes a HRS 550 to a LRS 560 transition, shown as a jump in current Irs across the Vset value. The current Irs can increase to a maximum value, which is determined by the gate voltage Vg. A power supply voltage Vdd, which is higher than the set voltage Vset, can be applied to the resistive switching element. With Vdd, the resistance of the resistive switching element is a function of gate voltage Vg, e.g., higher Vg values can result in higher current Irs values and lower resistance Rrs values. As shown, the voltage supply Vdd for the transistor can be selected in the saturation regime of the transistor, e.g., in regions in which the current I is essentially constant with respect to voltage V.

Figure 6A:
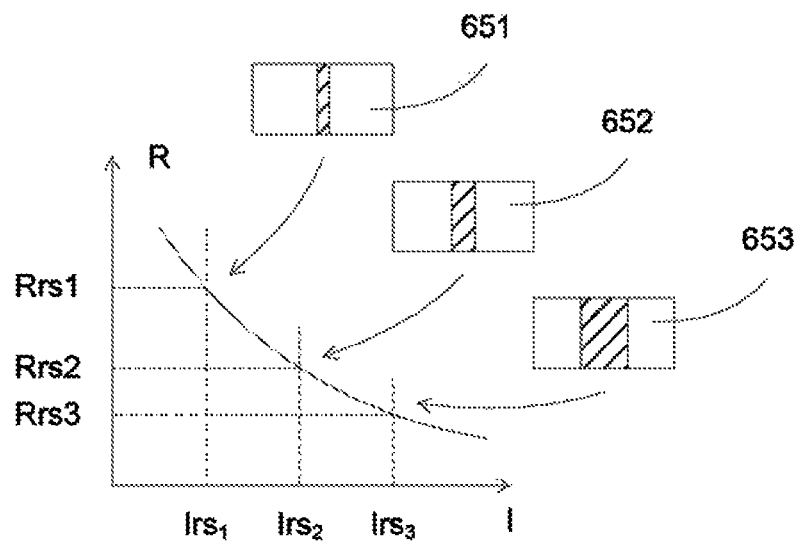
FIGS. 6A-6B illustrate behaviors of a sample and hold circuit according to some embodiments.
Figure 6B:
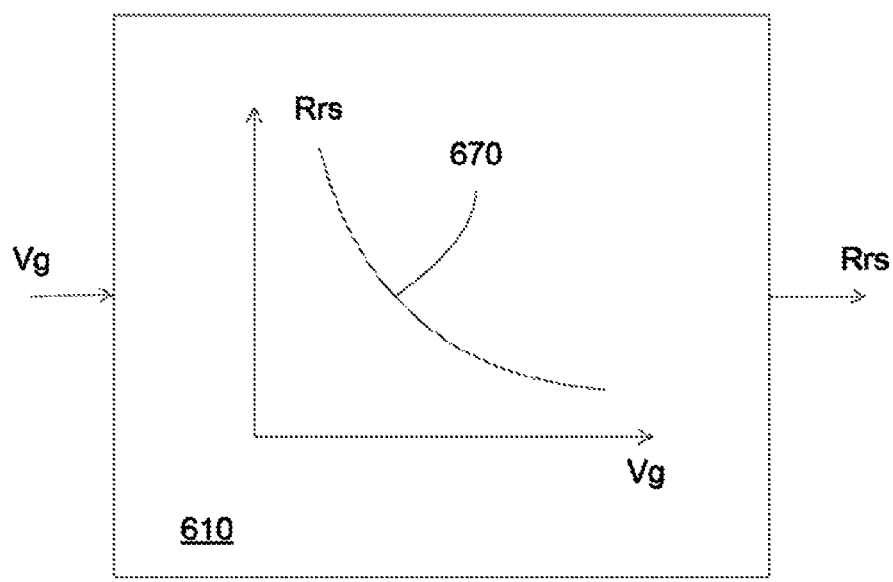

FIGS. 6A-6B illustrate behaviors of a sample and hold circuit according to some embodiments. FIG. 6A shows a relationship of the resistance of the resistive switching element with the current through the resistive switching element at Vdd. Higher gate voltage Vg can allow higher current Irs through the transistor 522, which corresponds to lower resistance Rrs setting for the resistive switching element. For example, at low current $Irs_1$, the filament 651 through the resistive switching element can be small, resulting in a high resistance $Rrs_1$. At middle current $Irs_2$, the filament 652 through the resistive switching element can be larger, resulting in a lower resistance $Rrs_2$. At high current $Irs_3$, the filament 653 through the resistive switching element can be even larger, resulting in a lowest resistance $Rrs_3$. Under the 1 T1R theory, the product of the current Irs and the resistance Rrs is a constant $$R_{rs} \bullet I_{rs} = \alpha$$

with α being a proportional constant. Thus the curve R-I shows a hyperbola characteristic.

FIG. 6B shows a sample and hold circuit 610 having a resistance-voltage transfer function, e.g., accepting an input voltage Vg and generating an output resistance Rrs.

For a field effect transistor (FET) device, the current Irs through the transistor 522 is related to the gate voltage Vg as followed, with Vth being the threshold voltage of the transistor 522

$$I_{rs} = k(V_g - V_{th})^2$$

The resistance Rrs can be seen as a function 670 of the input voltage Vg $$R_{rs} = \frac{\alpha}{I_{rs}} = \frac{\alpha}{k(V_g - V_{th})^2}$$

The resistance Rrs can be used to generate corresponding voltage or current. For example, by applying a voltage Vsense to the resistive switching element, the current Isense through the resistive switching element can be $$I_{sense} = \frac{V_{sense}}{R_{rs}} = \frac{I_{rs}}{\alpha} V_{sense} = \frac{k(V_g - V_{th})^2}{\alpha} V_{sense}$$

In some embodiments, the transistor can include a transistor having low or zero threshold voltage, for example, to simplify the relationship between the voltage and current through the transistor. Alternatively, compensation circuit can be used to reduce or eliminate the effect of the threshold voltage dependency of the I-V relationship.

FIGS. 7A-7B illustrate flowcharts for forming and operating a nonvolatile sample and hold circuit having a resistive switching element according to some embodiments. The resistive switching element can be an insulator or dielectric layer disposed between two electrodes. The described flowchart is a general description of techniques used to form the memory devices described above. The flowchart describes techniques for forming a sample and hold circuit generally including a resistive switching element and other support circuitries, such as a current control device. Although certain processing techniques and specifications are described, it is understood that various other techniques and modifications of the techniques described herein may also be used.

FIG. 7A describes a formation of a nonvolatile sample and hold circuit having a resistive switching element. The sample and hold circuit can sample an input voltage, and hold the value of the input voltage in a form of resistance stored in the resistive switching element. Since the resistive switching element is nonvolatile, the holding value can be stored for long time periods. In addition, the response time of the resistive switching element can be short, e.g., in order of picosecond range, the sampling operation can be considered as instantaneous.

Operation 700 forms a nonvolatile sample and hold circuit. The nonvolatile sample and hold circuit can include a resistive switching device and a current control device, with the current control device configured to accept an input voltage, and also configured to control a current through the resistive switching device as a function of the input voltage. The current control device can include low threshold voltage transistors, zero threshold voltage transistors, or compensation circuitry to reduce or eliminate the dependency of threshold voltage. The nonvolatile sample and hold circuit is operable as a sample and hold circuit, e.g., including the function of sampling an input voltage and holding the sampled voltage until a next sampling time. The hold functionality of the sample and hold circuit can be implemented by the resistive switching element, e.g., the sampled input voltage can be used to set the resistance of the resistive switching element so that the resistance of the resistive switching element is a function of the sampled input voltage.

The resistive switching element can include an insulator layer, such as a metal oxide layer of $TiO_2$, $HfO_2$, $ZnO_2$, $Al_2O_3$, strontium titanate (STO), indium gallium zinc oxide (IGZO), or $SnO_2$. The insulator layer can include a transition metal oxide. The thickness of the insulator layer can be between 3 nm and 30 nm. In some embodiments, the insulator layer can include any combinations of metal and metal oxide, chalcogenite and perovskite layers.

An optional treatment can be performed after forming the insulator layer. The treatment can include a plasma treatment or a high temperature treatment. For example, the treatment can include a rapid thermal oxidation at 300 C in oxygen ambient. The treatment can be performed in-situ after the deposition of the first electrode layer. The treatment can include an oxygen radical anneal, e.g., plasma anneal in an oxygen ambient.

In some embodiments, the insulator layer can be deposited by a PVD or ALD process. For example, an ALD process can include $O_3$ oxidant, at about 250-300 C deposition temperature, using tetrakis (ethylmethylamino) zirconium (TEMAZ), Tris (dimethylamino) cyclopentadienyl Zirconium, tetrakis (ethylmethylamino) hafnium (TEMAHf), tetrakis (dimethylamido) hafnium (TDMAHf) precursors.

The insulator can be formed between two electrodes. The electrodes can be a polysilicon layer or a metal containing layer. For example, the electrodes can be a highly doped polysilicon layer that is formed using a conventional chemical vapor deposition (CVD) or atomic layer deposition (ALD) type polysilicon deposition technique. Alternatively, the electrodes can include TiN, TaN, Ni, Pt, or Ru. Other elements can also be used, such as Ti, Al, $MoO_2$, W, poly-Si, TiSiN, TaSiN, or any combination, mixture or alloy thereof that can be formed using PVD or other processes. Other processing techniques, such as ALD, pulsed layer deposition (PLD), physical vapor deposition (PVD), CVD, evaporation, etc. can also be used to deposit the electrodes. The electrodes can have any thickness, for example between about 5 nm and about 500 nm thick.

FIG. 7B shows an operation of a nonvolatile sample and hold circuit having a resistive switching element. After an input voltage is applied to the sample and hold circuit, a sampled voltage can be provided, which can be used to set the resistance of the resistive switching element.

Operation 730 provides a circuit having a resistive switching device and a current controlling device. The circuit can be a nonvolatile sample and hold circuit. Operation 740 applies an input voltage to the circuit to achieve a sample and hold function, wherein the circuit comprises a transfer function of a resistance—voltage curve.

In some embodiments, the nonvolatile sample and hold circuit can include a reset circuit, which is operable to reset the resistive switching element, e.g., placing the resistive switching element to the high resistance state. Thus upon an input signal, such as a sampled voltage, the resistive switching element can be set to have a resistance corresponded to the input signal. The resistance response of the resistive switching element is typically not linear as discussed above. Linear response can be achieved with an additional circuit that has an inverse response as the resistance response.

The reset circuit can include a voltage source or a pulse voltage source that can supply a voltage equal or greater than the voltage that can reset the resistive switching element, e.g., transitioning the resistive switching element to the high resistance state. The reset circuit can be supplied to the resistive switching element before or during the sampling period, e.g., to prepare the resistive switching element for the sampled signal.

Figure 8A:
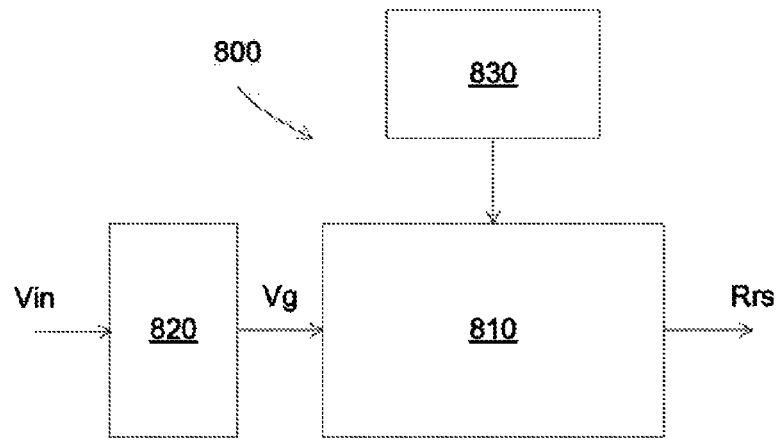
FIGS. 8A-8B illustrate schematic diagrams of a nonvolatile sample and hold circuit having a reset circuit according to some embodiments.
Figure 8B:
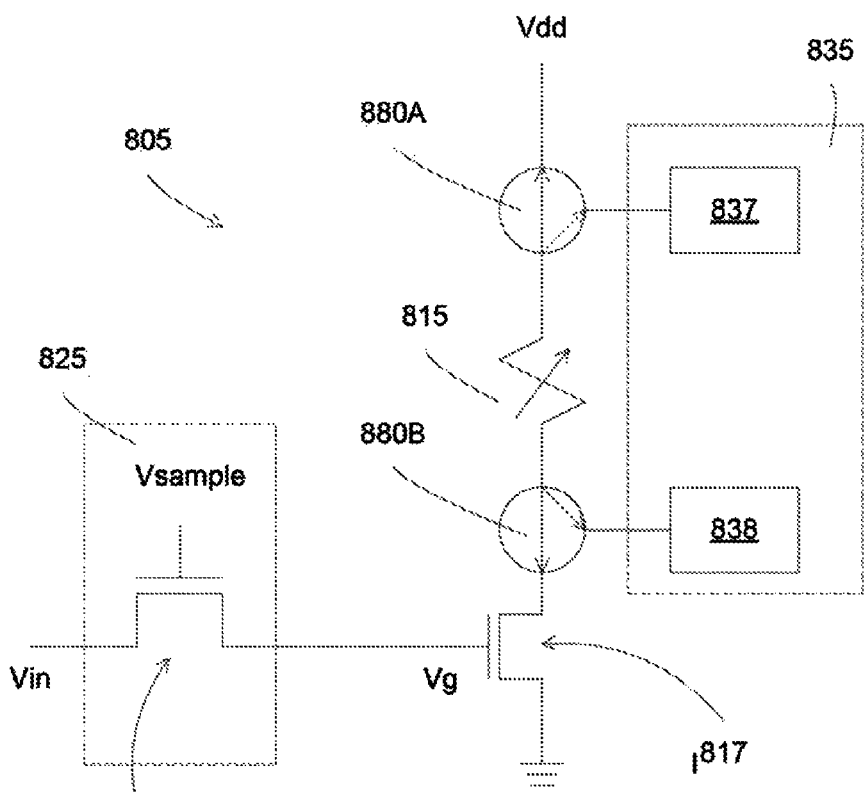

FIGS. 8A-8B illustrate schematic diagrams of a nonvolatile sample and hold circuit having a reset circuit according to some embodiments. FIG. 8A shows a simplified block diagram of a circuit 800 that can provide a nonvolatile sample and hold function using a resistive switching element. The circuit 800 can include a resistive switching circuit 810, e.g., a circuit having a resistive switching element. The resistive switching circuit 810 can also include a current control circuit to control the current passing through the resistive switching element. The resistive switching circuit 810 can be operable to accept an input voltage Vg, and provide a resistance response Rrs that corresponds to the input signal Vg. The resistive switching circuit 810 can be similar to a circuit having a resistance-voltage transfer function discussed above.

The circuit 800 can include a sampling circuit 820, which can be operable to sample an input signal such as an input voltage Vin, to provide a sampled voltage Vg. The sampling circuit can include a switch circuit, which can be operable to connect the input voltage Vin with the output voltage Vg. During the sampling period, the switch can be closed, e.g., connected, so that the output voltage Vg is equal to the input voltage Vin. When not sampling, the switch can be open, e.g., disconnected, so that the input voltage and the output voltage are independent of each other. The switch circuit can include a field effect transistor controlled by a sampling signal.

The circuit 800 can include a reset circuit 830, which can be operable to reset the resistive switching circuit 810, e.g., resetting the resistance of the resistive switching element in the resistive switching circuit 810. The reset circuit 830 can include a voltage or current source, which is continuous or pulsed, and which can provide a signal to transition the resistive switching element to a high resistance state.

In some embodiments, the reset circuit 830 can reset the resistive switching circuit 810, e.g., a voltage equal or greater (in magnitude) than the voltage that can reset the resistive switching element can be applied to the resistive switching element to put the resistive switching element to a high resistance value. The sampling circuit 820 can then sample the input voltage Vin, generating a sampled voltage Vg to be supplied to the resistive switching circuit 810. Upon the application of the sampled voltage Vg, the resistive switching circuit 810 can generate a resistance response Rrs, having a resistance value that corresponds to the sampled signal Vg. The resistance response Rrs can be held indefinitely, until a next pulse of sampling signal.

FIG. 8B shows a simplified circuit diagram of a circuit 805 that can provide a nonvolatile sample and hold function using a resistive switching element. The circuit 805 can include a resistive switching circuit, e.g., a circuit having a resistive switching element 815 and a transistor 817 acting as a current control circuit to control the current passing through the resistive switching element 815. The resistive switching circuit 810 can be operable to accept an input voltage Vg to set the resistance of the resistive switching element 815 to be corresponded to, e.g., as a function of, the input signal Vg.

The circuit 805 can include a sampling circuit 825, which can be operable to sample an input voltage Vin, to provide a sampled voltage Vg. The sampling circuit 825 can include a field effect transistor 827 acting as switch circuit to controllably connecting or disconnecting the input voltage Vin with the output voltage Vg. The transistor 827 can be controlled by a sampling signal Vsample.

The circuit 805 can include a reset circuit 835, which can reset the resistive switching element 815 to a high resistance state. The reset circuit 835 can include a voltage source 837 or 838, which can provide a reset signal to transition the resistive switching element 815. A set of switches 880A and 880B can be included to toggle the resistive switching element 815 between the resistive switching circuit (including Vdd and transistor 817) and the reset circuit 835. In one toggle position, the reset circuit 835 is configured to control the resistive switching element 815, e.g., for resetting the resistive switching element 815. In another toggle position, the resistive switching circuit is configured to control the resistive switching element 815, e.g., for setting the resistive switching element to have a resistance corresponded to the sampled voltage Vg.

In some embodiments, in operation, the reset circuit 835 can reset the resistive switching element, e.g., the set of switches 880A/880B is toggled to the reset circuit 835, and a reset voltage is applied to the resistive switching element 815. The sampling circuit 825 can then sample the input voltage Vin, generating a sampled voltage Vg to control the current of the transistor 817. Upon the application of the sampled voltage Vg, the resistance of the resistive switching element 815 is set to a resistance Rrs that is correlated to the sampled voltage Vg.

Figure 9A:
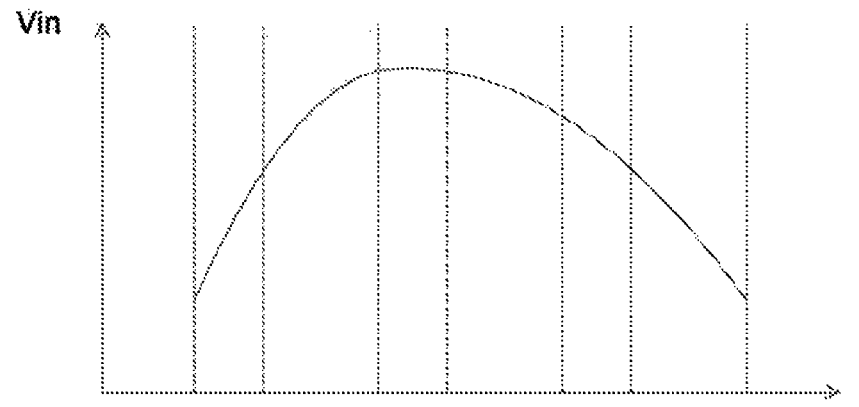
FIGS. 9A-9C illustrate responses of a nonvolatile sample and hold circuit according to some embodiments.
Figure 9B:
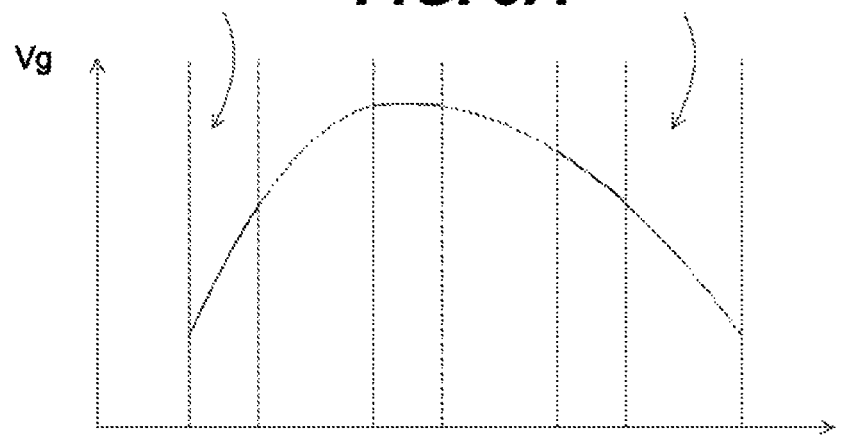
Figure 9C:
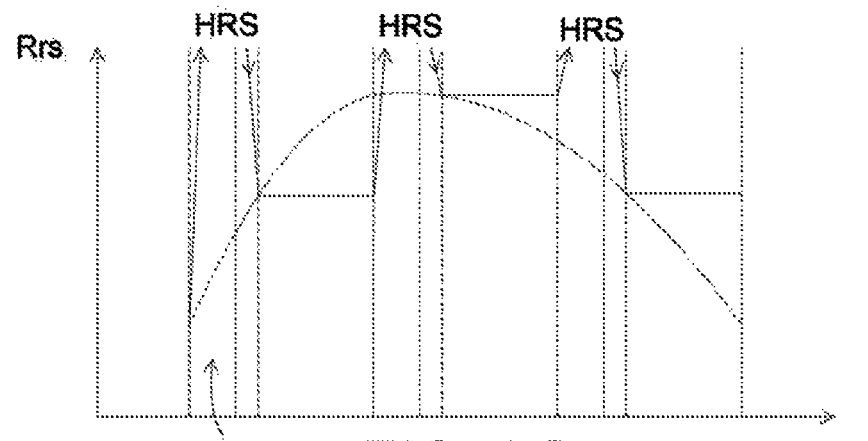

FIGS. 9A-9C illustrate responses of a nonvolatile sample and hold circuit according to some embodiments. FIG. 9A shows an input voltage Vin as a function of time. FIG. 9B shows a sampled voltage Vg, which is equal to the input voltage Vin at sampling time 910. At non sampling time 920, the sampling voltage Vg can be floating, such as at a zero voltage. The dash line shows the input voltage Vin. FIG. 9C shows a resistance Rrs of the resistive switching element. In the sampling time 910, the resistance Rrs is first reset during the reset time 930 to be in a HRS. After being reset, the resistance Rrs is then set to a resistance value corresponded to the sampled signal Vg. As shown, the resistance value Rrs is similar to the sampled signal Vg, e.g., a linear relationship. This is merely illustrative, and any relationship, linear or non linear can be existed between the resistance Rrs and the sampled voltage Vg, depending on the particular circuit. As shown, the reset time 930 is a part of the sampling time 910. Other configurations can also be used, such as the reset time can be before the sampling time.

Further, the reset time 930 and the sampling time 910 are shown as a long period to illustrate the behavior of the nonvolatile sample and hold circuit. In practice, these times can be short, for example, in order of picoseconds or nanoseconds, depending on the response time of the resistive switching element.

FIGS. 10A-10B illustrate other flowcharts for forming and operating a nonvolatile sample and hold circuit having a resistive switching element according to some embodiments. FIG. 10A shows a formation of a nonvolatile sample and hold circuit having a resistive switching element. The sample and hold circuit can be operable to accept an input voltage, generating a sampled input voltage, and setting the resistance of the resistive switching element, after resetting the resistive switching circuit.

Operation 1000 forms a nonvolatile sample and hold circuit. The nonvolatile sample and hold circuit can include a resistive switching circuit, a sampling circuit, and a reset circuit. The resistive switching circuit can be operable to generate a resistance Rrs in responded to an applied voltage Vg. The sampling circuit can be operable to sample an input voltage Vin to generate a sampled voltage Vg. The reset circuit can be operable to reset the resistive switching element in the resistive switching circuit to a high resistance state. A toggle circuit can also be included to toggle control of the resistive switching element between the reset circuit and the resistive switching circuit.

The nonvolatile sample and hold circuit is operable as a sample and hold circuit, e.g., including the function of sampling an input voltage and holding the sampled voltage until a next sampling time.

FIG. 10B shows an operation of a nonvolatile sample and hold circuit having a resistive switching element. After an input voltage is applied to the sample and hold circuit, a sampled voltage can be provided, which can be used to set the resistance of the resistive switching element, after the resistive switching element has been reset.

Operation 1030 provides a circuit having a resistive switching circuit, a sampling circuit and a reset circuit. The circuit can be a nonvolatile sample and hold circuit. Operation 1040 resets the resistive switching circuit, such as applying a reset voltage to the resistive switching element to transition the resistive switching element to a high resistance state. An optional toggling operation can be performed, to switch control of the resistive switching element to the reset circuit.

Operation 1050 samples an input voltage to generate a sampled voltage. The sampled voltage can be equal to the input voltage at the sampling time. Alternatively, the sampled voltage can be proportional, e.g., linearly corresponded, or non linearly corresponded to the input voltage at the sampling time. The sampling operation can be performed after or at the same time as the resetting operation.

Operation 1060 applies the sampled voltage to the resistive switching circuit. An optional toggling operation can be performed, to switch control of the resistive switching element back from the reset circuit.

In some embodiments, the nonvolatile sample and hold circuit can include a converter circuit, which is operable to convert the resistance response of the resistive switching circuit, for example, to generate a voltage output Vout from the resistance output Rrs. Thus upon an input signal, such as a sampled voltage, an output voltage can be generated from the set resistance of the resistive switching element, which has been set to have a resistance corresponded to the input signal. The output voltage response can be non linear since a typical response of the resistive switching element is non linear as discussed above. Linear response can be achieved with an additional circuit that has an appropriate compensation response.

The converter circuit can include a voltage source (continuous or pulsed), a current source (continuous or pulsed), or any other circuitry. For example, a read circuit of a resistive memory device can be used to convert the resistance of the resistive switching element to a voltage or a current. The converter circuit can be supplied to the resistive switching element after the sampling period, e.g., after the resistive switching element has responded to the sampled signal.

Figure 11A:
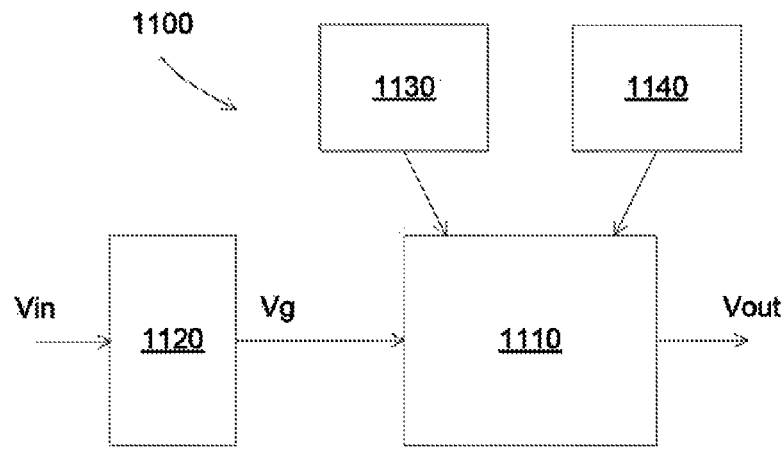
FIGS. 11A-11B illustrate schematic diagrams of a nonvolatile sample and hold circuit having a reset and a converter circuits according to some embodiments.
Figure 11B:
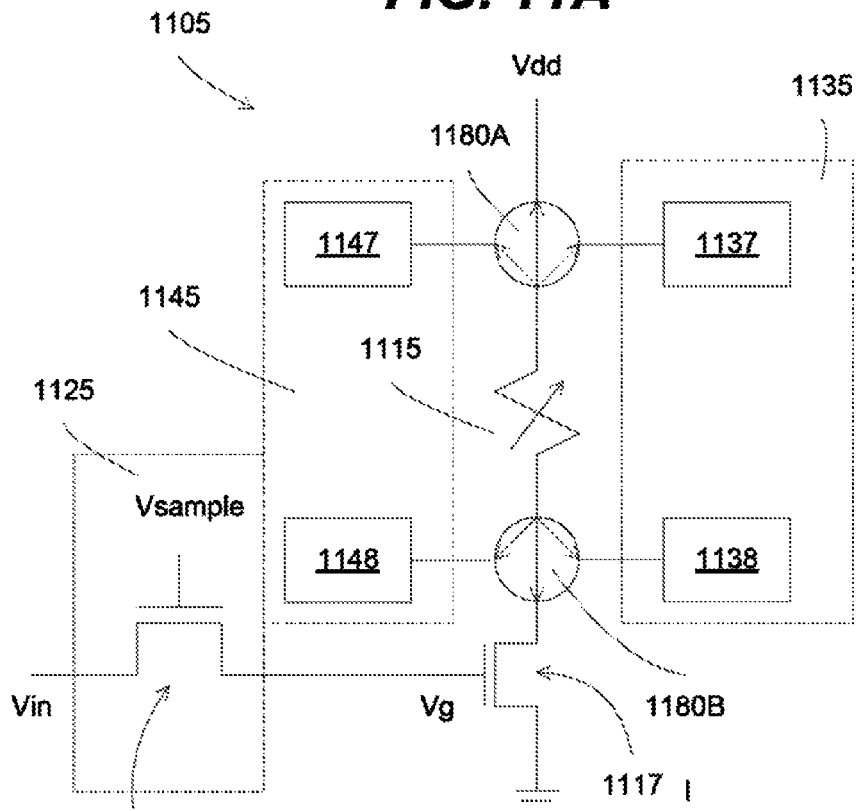

FIGS. 11A-11B illustrate schematic diagrams of a nonvolatile sample and hold circuit having a reset and a converter circuits according to some embodiments. FIG. 11A shows a simplified block diagram of a circuit 1100 that can provide a nonvolatile sample and hold function using a resistive switching element. The circuit 1100 can include a resistive switching circuit 1110, e.g., a circuit having a resistive switching element. The resistive switching circuit 1110 can also include a current control circuit to control the current passing through the resistive switching element. The resistive switching circuit 1110 can be operable to accept an input voltage Vg, and provide a resistance response Rrs that corresponds to the input signal Vg. The resistive switching circuit 1110 can be similar to a circuit having a resistance-voltage transfer function discussed above.

The circuit 1100 can include a sampling circuit 1120, which can be operable to sample an input signal such as an input voltage Vin, to provide a sampled voltage Vg. The sampling circuit can include a switch circuit, which can be operable to connect the input voltage Vin with the output voltage Vg. During the sampling period, the switch can be closed, e.g., connected, so that the output voltage Vg is equal to the input voltage Vin. When not sampling, the switch can be open, e.g., disconnected, so that the input voltage and the output voltage are independent of each other. The switch circuit can include a field effect transistor controlled by a sampling signal.

The circuit 1100 can include a reset circuit 1130, which can be operable to reset the resistive switching circuit 1110, e.g., resetting the resistance of the resistive switching element in the resistive switching circuit 1110. The reset circuit 1130 can include a voltage or current source, which is continuous or pulsed, and which can provide a signal to transition the resistive switching element to a high resistance state.

In some embodiments, the reset circuit 1130 can reset the resistive switching circuit 1110, e.g., a voltage equal or greater (in magnitude) than the voltage that can reset the resistive switching element can be applied to the resistive switching element to put the resistive switching element to a high resistance value. The sampling circuit 1120 can then sample the input voltage Vin, generating a sampled voltage Vg to be supplied to the resistive switching circuit 1110. Upon the application of the sampled voltage Vg, the resistive switching circuit 1110 can generate a resistance response Rrs, having a resistance value that corresponds to the sampled signal Vg. The resistance response Rrs can be held indefinitely, until a next pulse of sampling signal.

The circuit 1100 can include a converter circuit 1140, which can be operable to convert the resistive switching circuit 1110, e.g., converting the resistance of the resistive switching element to a desired response, such as an output voltage or an output current. The converter circuit 1140 can include a voltage or current source, which is continuous or pulsed, and which can provide a signal to the resistive switching element to generate a voltage or a current, which is corresponded to the value of the resistance of the resistive switching element. For example, if the converter circuit includes a linear current source, a voltage can be generated which is linearly proportional to the resistance. If the converter circuit includes a non linear source, a non linear signal to the resistance can be generated.

In some embodiments, the reset circuit 1130 can reset the resistive switching circuit 1110, e.g., a voltage equal or greater (in magnitude) than the voltage that can reset the resistive switching element can be applied to the resistive switching element to put the resistive switching element to a high resistance value. The sampling circuit 1120 can then sample the input voltage Vin, generating a sampled voltage Vg to be supplied to the resistive switching circuit 1110. Upon the application of the sampled voltage Vg, the resistive switching circuit 1110 can generate a resistance response Rrs, having a resistance value that corresponds to the sampled signal Vg. The converter circuit 1140 can convert the resistance Rrs to a desired signal, such as an output voltage Vout. The output voltage response Vout can be held indefinitely, until a next pulse of sampling signal.

FIG. 11B shows a simplified circuit diagram of a circuit 1105 that can provide a nonvolatile sample and hold function using a resistive switching element. The circuit 1105 can include a resistive switching circuit, e.g., a circuit having a resistive switching element 1115 and a transistor 1117 acting as a current control circuit to control the current passing through the resistive switching element 1115. The resistive switching circuit 1110 can be operable to accept an input voltage Vg to set the resistance of the resistive switching element 1115 to be corresponded to, e.g., as a function of, the input signal Vg.

The circuit 1105 can include a sampling circuit 1125, which can be operable to sample an input voltage Vin, to provide a sampled voltage Vg. The sampling circuit 1125 can include a field effect transistor 1127 acting as switch circuit to controllably connecting or disconnecting the input voltage Vin with the output voltage Vg. The transistor 1127 can be controlled by a sampling signal Vsample.

The circuit 1105 can include a reset circuit 1135, which can reset the resistive switching element 1115 to a high resistance state. The reset circuit 1135 can include a voltage source 1137 or 1138, which can provide a reset signal to transition the resistive switching element 1115. A set of switches 1180A and 1180B can be included to toggle the resistive switching element 1115 between the resistive switching circuit (including Vdd and transistor 1117) and the reset circuit 1135. In one toggle position, the reset circuit 1135 is configured to control the resistive switching element 1115, e.g., for resetting the resistive switching element 1115. In another toggle position, the resistive switching circuit is configured to control the resistive switching element 1115, e.g., for setting the resistive switching element to have a resistance corresponded to the sampled voltage Vg.

In some embodiments, in operation, the reset circuit 1135 can reset the resistive switching element, e.g., the set of switches 1180A/880B is toggled to the reset circuit 1135, and a reset voltage is applied to the resistive switching element 1115. The sampling circuit 1125 can then sample the input voltage Vin, generating a sampled voltage Vg to control the current of the transistor 1117. Upon the application of the sampled voltage Vg, the resistance of the resistive switching element 1115 is set to a resistance Rrs that is correlated to the sampled voltage Vg.

The circuit 1105 can include a converter circuit 1145, which can convert the resistance of the resistive switching element 1115 to a desired signal, such as an output voltage. The converter circuit 1145 can include a voltage source 1147 or 1148, which can provide a converter signal to read the resistive switching element 1115. The set of switches 1180A and 1180B can be used to toggle the resistive switching element 1115 between the resistive switching circuit (including Vdd and transistor 1117), the reset circuit 1135, and the converter circuit 1145. In one toggle position, the reset circuit 1135 is configured to control the resistive switching element 1115, e.g., for resetting the resistive switching element 1115. In another toggle position, the resistive switching circuit is configured to control the resistive switching element 1115, e.g., for setting the resistive switching element to have a resistance corresponded to the sampled voltage Vg. In further another toggle position, the converter circuit 1145 is configured to convert the resistance of the resistive switching element 1115 to a desired signal output.

In some embodiments, in operation, the reset circuit 1135 can reset the resistive switching element, e.g., the set of switches 1180A/880B is toggled to the reset circuit 1135, and a reset voltage is applied to the resistive switching element 1115. The sampling circuit 1125 can then sample the input voltage Vin, generating a sampled voltage Vg to control the current of the transistor 1117. Upon the application of the sampled voltage Vg, the resistance of the resistive switching element 1115 is set to a resistance Rrs that is correlated to the sampled voltage Vg. The converter circuit 1145 then can convert the set resistance to a desired output, such as an output voltage.

Figure 12A:
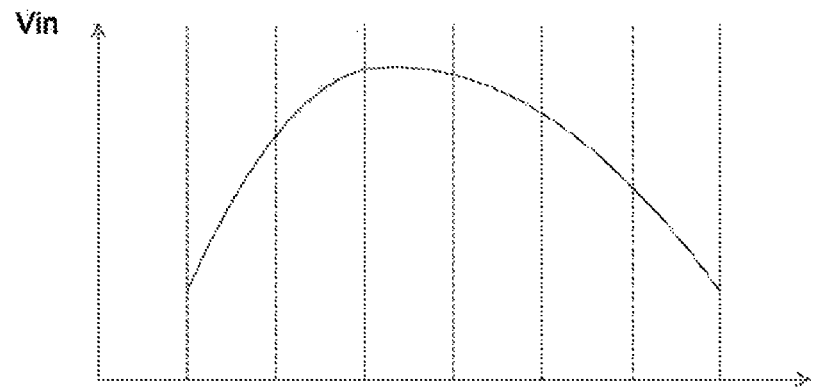
FIGS. 12A-12C illustrate responses of a nonvolatile sample and hold circuit according to some embodiments.
Figure 12B:
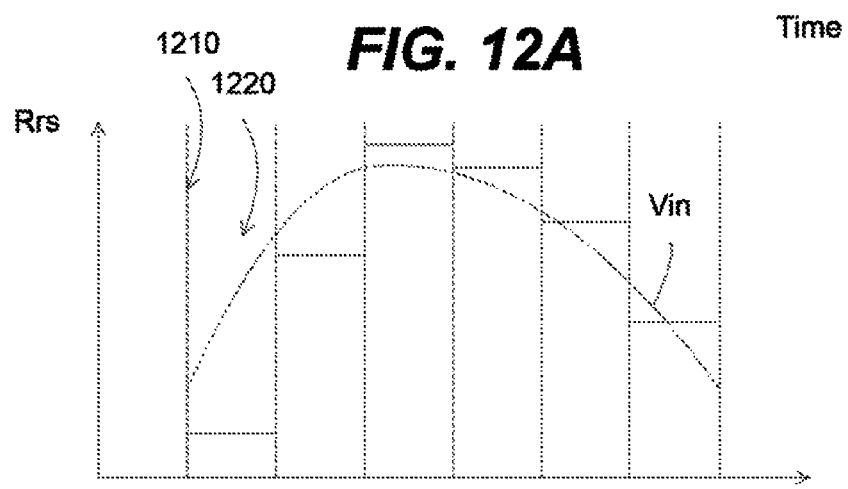
Figure 12C:
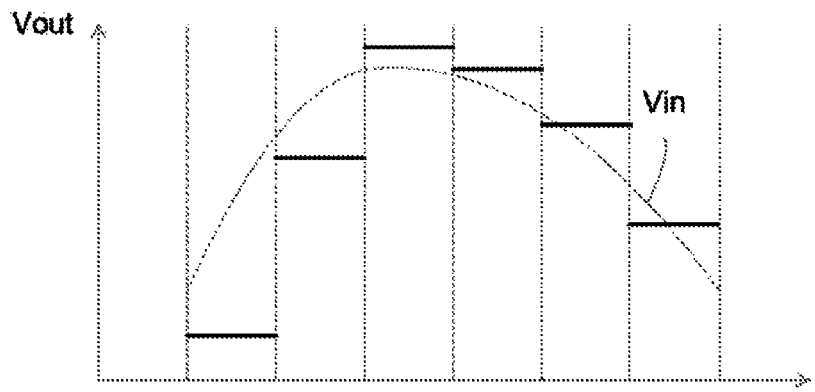

FIGS. 12A-12C illustrate responses of a nonvolatile sample and hold circuit according to some embodiments. FIG. 12A shows an input voltage Vin as a function of time. A sampled voltage Vg, which can be equal to the input voltage Vin at sampling time 1210, can be used to set the resistance Rrs. FIG. 12B shows a resistance Rrs of the resistive switching element following a sampling time 1210. The resistance Rrs can be held constant during the hold time 1220.

In the sampling time 1210, the resistance Rrs can be first reset to be in a HRS. After being reset, the resistance Rrs is then set to a resistance value corresponded to the sampled signal Vg. As shown, the resistance value Rrs is different to the sampled signal Vg, e.g., a non linear relationship. This is merely illustrative, and any relationship, linear or non linear can be existed between the resistance Rrs and the sampled voltage Vg, depending on the particular circuit. The reset time and the sampling time 1210 are shown as instantaneous to illustrate the practical behavior of the nonvolatile sample and hold circuit, which is much faster as compared to the hold time 1220.

FIG. 12C shows an output voltage Vout, generated from a converter circuit. As shown, the converter circuit can include a constant current source, which can pass through the resistive switching element to generate an output voltage proportional to the resistance value. The output voltage Vout is sampled during the sampling time 1210, and then hold its value during the hold time 1220.

FIGS. 13A-13B illustrate other flowcharts for forming and operating a nonvolatile sample and hold circuit having a resistive switching element according to some embodiments. FIG. 13A shows a formation of a nonvolatile sample and hold circuit having a resistive switching element. The sample and hold circuit can be operable to accept an input voltage, generating a sampled input voltage, and generating an output voltage that can be held constant during a hold time.

Operation 1300 forms a nonvolatile sample and hold circuit. The nonvolatile sample and hold circuit can include a resistive switching circuit, a sampling circuit, a reset circuit, and a converter circuit. The resistive switching circuit can be operable to generate a resistance Rrs in responded to an applied voltage Vg. The sampling circuit can be operable to sample an input voltage Vin to generate a sampled voltage Vg. The reset circuit can be operable to reset the resistive switching element in the resistive switching circuit to a high resistance state. The converter circuit can be operable to convert the resistance of the resistive switching circuit to an output voltage. A toggle circuit can also be included to toggle control of the resistive switching element between the reset circuit, the converter circuit, and the resistive switching circuit.

The nonvolatile sample and hold circuit is operable as a sample and hold circuit, e.g., including the function of sampling an input voltage and holding the sampled voltage until a next sampling time.

FIG. 13B shows an operation of a nonvolatile sample and hold circuit having a resistive switching element. After an input voltage is applied to the sample and hold circuit, a sampled voltage can be provided, which can be used to set the resistance of the resistive switching element, after the resistive switching element has been reset.

Operation 1330 provides a circuit having a resistive switching circuit, a sampling circuit, a reset circuit, and a converter circuit. The circuit can be a nonvolatile sample and hold circuit. Operation 1340 resets the resistive switching circuit, such as applying a reset voltage to the resistive switching element to transition the resistive switching element to a high resistance state. An optional toggling operation can be performed, to switch control of the resistive switching element to the reset circuit.

Operation 1350 samples an input voltage to generate a sampled voltage. The sampled voltage can be equal to the input voltage at the sampling time. Alternatively, the sampled voltage can be proportional, e.g., linearly corresponded, or non linearly corresponded to the input voltage at the sampling time. The sampling operation can be performed after or at the same time as the resetting operation.

Operation 1360 applies the sampled voltage to the resistive switching circuit. An optional toggling operation can be performed, to switch control of the resistive switching element back from the reset circuit.

Operation 1370 converts the resistance of the resistive switching circuit to an output voltage, for example, by applying a current or a voltage to the resistive switching element to read the resistive switching element. An optional toggling operation can be performed, to switch control of the resistive switching element to the converter circuit.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A sample-and-hold circuit comprising
a sample circuit,
   wherein the sample circuit is configured to accept a first voltage,
   wherein the sample circuit is configured to output a second voltage,
   wherein the second voltage is a sample of the first voltage;
a first current circuit,
   wherein the first current circuit comprises an input,
   wherein the first current circuit is coupled to the sample circuit,
   wherein the second voltage is coupled to the input of the first current circuit,
   wherein the first current circuit is configured to output a first current,
   wherein the first current is related to the second voltage;
a resistive switching device,
   wherein the resistive switching device comprises a resistive switching element,
   wherein the resistive switching device is coupled to the first current circuit,
   wherein the first current is coupled to the resistive switching device; and
a second current circuit,
   wherein the second current circuit is coupled to the resistive switching device to generate a voltage relating to the resistance of the resistive switching device.

2. A sample-and-hold circuit as in claim 1
wherein the sample circuit comprises a transistor.

3. A sample-and-hold circuit as in claim 1
wherein the sample circuit is configured to accept a sample pulse.

4. A sample-and-hold circuit as in claim 1
wherein the first current circuit comprises a transistor.

5. A sample-and-hold circuit as in claim 1
wherein the first current circuit comprises a zero threshold transistor.

6. A sample-and-hold circuit as in claim 1
wherein the first current circuit comprises a transistor,
wherein the transistor is configured to be operable in saturation mode.

7. A sample-and-hold circuit as in claim 1
wherein the first current circuit comprises a current-voltage curve having zero current at zero voltage.

8. A sample-and-hold circuit as in claim 1
wherein the second current circuit is operable to output a constant current.

9. A sample-and-hold circuit as in claim 1
wherein the second current circuit is operable to output a second current so that a voltage across the resistive switching device is proportional to the resistance of the resistive switching device.

10. A sample-and-hold circuit as in claim 9 further comprising
a switching circuit,
   wherein the switching circuit is coupled to the resistive switching device,
   wherein the switching circuit is configured to switch the resistive switching device between the first current circuit and the second current circuit.

11. A sample-and-hold circuit as in claim 1 further comprising
a reset circuit,
   wherein the reset circuit is configured to put the resistive switching element to a high resistance state.

12. A sample-and-hold circuit as in claim 11
wherein the reset circuit comprises a voltage source,
wherein the voltage source is operable to output a voltage higher in magnitude than a reset voltage of the resistive switching element.

13. A circuit comprising
a sample-and-hold circuit,
   wherein the sample-and-hold circuit comprises a resistive switching device and a peak detector circuit.

14. A circuit as in claim 13 further comprising
an analog-to-digital converter.

15. A method for forming a circuit comprising a sample-and hold circuit, the method comprising
 forming a sample circuit,
  wherein the sample circuit is configured to accept a first voltage,
  wherein the sample circuit is configured to output a second voltage,
  wherein the second voltage is a sample of the first voltage;
 forming a first current circuit,
  wherein the first current circuit comprises an input,
  wherein the first current circuit is coupled to the sample circuit,
  wherein the second voltage is coupled to the input of the first current circuit,
  wherein the first current circuit is configured to output a first current,
  wherein the first current is related to the second voltage;
 forming a resistive switching device,
  wherein the resistive switching device comprises a resistive switching element,
  wherein the resistive switching device is coupled to the first current circuit,
  wherein the first current is coupled to the resistive switching device; and
 forming a second current circuit,
  wherein the second current circuit is coupled to the resistive switching device to generate a voltage relating to the resistance of the resistive switching device.

16. A method as in claim 15 further comprising
 forming a switching circuit,
  wherein the switching circuit is coupled to the resistive switching device,
  wherein the switching circuit is configured to switch the resistive switching device between the first current circuit and the second current circuit.

17. A method as in claim 15 further comprising
 forming a reset circuit,
  wherein the reset circuit is configured to put the resistive switching element to a high resistance state,
  wherein the reset circuit comprises a voltage source,
  wherein the voltage source is operable to output a voltage higher in magnitude than a reset voltage of the resistive switching element.

* * * * *